US012025657B2

(12) United States Patent
Chou et al.

(10) Patent No.: US 12,025,657 B2
(45) Date of Patent: Jul. 2, 2024

(54) SYSTEM FOR TESTING ANTENNA-IN-PACKAGE MODULES AND METHOD FOR USING THE SAME

(71) Applicant: OHMPLUS TECHNOLOGY INC., New Taipei (TW)

(72) Inventors: Hsi-Tseng Chou, New Taipei (TW); Chih-Wei Chiu, New Taipei (TW); Zhao-He Lin, New Taipei (TW); Jake Waldvogel Liu, New Taipei (TW)

(73) Assignee: Ohmplus Technology Inc., New Taipei (TW)

( * ) Notice: Subject to any disclaimer, the term of this patent is extended or adjusted under 35 U.S.C. 154(b) by 0 days.

(21) Appl. No.: 17/987,559

(22) Filed: Nov. 15, 2022

(65) Prior Publication Data

US 2023/0160955 A1    May 25, 2023

Related U.S. Application Data

(60) Provisional application No. 63/264,309, filed on Nov. 19, 2021.

(51) Int. Cl.
  *G01R 31/302*    (2006.01)
  *G01R 31/00*     (2006.01)
  *G01R 31/3183*   (2006.01)

(52) U.S. Cl.
  CPC ....... *G01R 31/3025* (2013.01); *G01R 31/002* (2013.01); *G01R 31/3183* (2013.01)

(58) Field of Classification Search
  None
  See application file for complete search history.

(56) References Cited

U.S. PATENT DOCUMENTS

| 2014/0256376 A1* | 9/2014 | Weissman | H04B 17/14 |
| | | | 455/550.1 |
| 2018/0070196 A1* | 3/2018 | Sanders | H01P 5/185 |
| 2019/0173592 A1* | 6/2019 | Wen | H04B 17/12 |
| 2020/0235774 A1* | 7/2020 | Lee | H03F 3/19 |

FOREIGN PATENT DOCUMENTS

| CN | 104881624 A | 9/2015 |
| CN | 108828538 A | 11/2018 |

OTHER PUBLICATIONS

Office Action mailed to Taiwanese Counterpart Patent Application No. 111133771 on Jun. 28, 2023.

\* cited by examiner

*Primary Examiner* — Nasima Monsur
(74) *Attorney, Agent, or Firm* — Rosenberg, Klein & Lee

(57) ABSTRACT

The invention describes a system for testing antenna-in-package (AiP) modules and a method for using the same. Firstly, AiP modules respectively receive RF signals from a testing transmitting antenna. Then, at least one of the power and the phase of each of the RF signals is adjusted to generate modulated RF amplified signals as recognition tags with difference. The RF amplified signals are received from each control integrated circuit (IC) and the power of the modulated RF amplified signals is summed to generate a net mixed test signal. Finally, the test signal is received and RF properties corresponding to at least one of the power and the phase of each of the RF amplified signals as recognition tags are obtained. The method can simultaneously test a plurality of AiP modules to shorten the test time.

12 Claims, 4 Drawing Sheets

SYSTEM FOR TESTING ANTENNA-IN-PACKAGE MODULES AND METHOD FOR USING THE SAME

This application claims priority of U.S. Provisional Application No. 63/264,309 filed on 19 Nov. 2021 under 35 U.S.C. § 119(e); the entire contents of all of which are hereby incorporated by reference.

BACKGROUND OF THE INVENTION

Field of the Invention

The present invention relates to a method for testing radio-frequency (RF) characteristics, particularly to a system for the testing of antenna-in-package (AiP) modules and a method for using the same.

Description of the Related Art

With the development and various applications of mobile communications, active antenna arrays are popularly used. An easy way of implementation is to build an antenna module that integrates antenna elements and active radio frequency (RF) devices into a single integrated chip package, which is called "Antenna in Package (AiP)". To characterize the AiPs. and extract their electronic and radiation parameters, the AiPs should be tested to ensure their performance in the development stage or on the mass production lines. In the development and production stages of the AiPs, a test setup is employed, where a package test socket is used to measure the electrical conductive parameters of the AiPs. During the testing measurement, the AiPs are arranged on the package test base, and the probe directly contacts the I/O and control pins of the AiP to form an electrical connection with the AiP. Then, the electrical conductive tests of the AiP are performed by transmitting and measuring the test signals.

FIG. 1 is a diagram schematically illustrating a conventional system for testing AiPs. Referring to FIG. 1, the system for testing AiPs includes a test base 10, a vector signal generator 11, a transmitting antenna 12, a RF switch 14, a controller 16, a microcontroller unit (MCU) 18, and a vector spectrum analyzer 20. The vector signal generator 11 drives the transmitting antenna 12 to emit RF signals R. The test base 10 is provided to install the AiPs 22. The RF switch 14 sequentially switches the AiPs 22 in a sequential order along different paths to test each AiPs 22 sequentially. The test base 10 has pins electrically connected to the 1/O pins of the AiPs 22 and controls the working states of the AiPs 22. The AiPs 22 receive the RF signals R. The RF signal R sequentially propagates through the RF switch 14. Finally, the RF signal R is received by the vector spectrum analyzer 20 to analyze the RF properties of the RF signal R through the AiPs 22. The RF switch 14 is configured to switch the path to the AiP 22 under test. This switching test continues until all AiPs' tests are completed.

When testing the first AiP 22, the switch 14 will switch the path to the one associated with the first AiP 22 and test the first AiP 22, and the other paths will be disconnected based on the switch's basic function. The RF signal R is simultaneously transmitted to the vector spectrum analyzer 20 to analyze the test results. After testing the first AiP 22, the switch 14 will switch the path to the one associated with the second AiP 22 to test the second AiP 22. Although the architecture of FIG. 1 has a low fabrication cost, the test time is very long, and the uncertainties from the switch will cause test errors. For example, in FIG. 1, the total test time will be 24 seconds if the test time of each AiP 22 is 6 seconds.

To overcome the abovementioned problems, the present invention provides a system for testing AiP modules and a method for using the same, so as to solve the aforementioned problems of the prior art.

SUMMARY OF THE INVENTION

The present invention provides a system for testing antenna-in-package (AiP) modules and a method for using the same, which shortens the test time and increases the testing accuracy.

In an embodiment of the present invention, a system for testing a group of active RF AiP modules includes a transmitting antenna, a modem, a plurality of directional couplers, a signal-controlling circuit, and a power combiner. The present invention of AiP module testing is explained in the receiving mode of the AiP modules. The testing of the transmitting mode can be performed by altering the signal flow directions without affecting the basic nature of the present invention. The testing RF signal is radiated from the transmitting antenna in an over-the-air antenna measurement system. The AiP modules are characterized by analyzing the testing RF signals received by the AiP modules and propagating through them in comparison to the original signals generated by the transmitting antenna from the system of signal source generator. The modem is electrically connected to a plurality of AiP modules and configured to control the plurality of AiP modules to respectively receive the testing RF signals. The plurality of directional couplers are respectively electrically connected to the plurality of AiP modules and the modem and respectively configured to receive the testing RF signals and transmit the testing RF signals to the modem to maintain the normal operation of the plurality of AiP modules. The signal-controlling circuit is electrically connected to the plurality of directional couplers and configured to receive the testing RF signals through the plurality of directional couplers. The signal-controlling circuit is configured to adjust at least one of the power and phase of each of the received testing RF signals to generate recognizable modulated RF amplified signals as recognition tags with different characteristics for each RF path associated with each of the AiP modules under test. With these recognition tags, the RF characteristics of each AiP module can be identified and separated for testing by a signal processing algorithm for demodulation to process the received testing signals after they propagate through the testing system and the AiP modules. The power combiner is electrically connected to the signal-controlling circuit. The power combiner is configured to receive the modulated RF amplified signals and sum the powers of the modulated RF amplified signals to generate a net mixed test signal. The signal analyzer is electrically connected to the power combiner and configured to receive the net mixed test signals which are processed by the signal processing algorithm for demodulation based on the recognition tags to obtain the RF properties corresponding to at least one of the power and phase of each of the modulated RF amplified signals.

In an embodiment of the present invention, the signal-controlling circuit includes a plurality of control integrated circuits (ICs) and a signal controller. The plurality of control ICs are respectively electrically connected to the plurality of directional couplers and the power combiner. The plurality of control ICs are respectively configured to generate the modulated RF signals. The signal controller is electrically connected to the plurality of control ICs. The signal controller is configured to control the plurality of control ICs to adjust at least one of the power and phase of each of the received RF signals to respectively generate the modulated RF amplified signals as recognition tags with different characteristics for each RF path associated with each of the AiP modules under test. With these recognition tags, the RF characteristics of each AiP module can be identified and separated for testing by a signal processing algorithm for demodulation.

In an embodiment of the present invention, each of the plurality of control ICs includes a phase shifter, a variable attenuator, and an amplifier to generate a modulated signal. The phase shifter is electrically connected to the signal controller and the plurality of directional couplers. The phase shifter is configured to receive the RF signal and generate the modulated RF signal from its output. The signal controller is configured to control the phase shifter to adjust the phase of the modulated RF signal. The variable attenuator is electrically connected to the signal controller and the phase shifter. The variable attenuator is configured to receive the RF signal from the phase shifter and generate the power ratio of the modulated RF signal between different RF paths. The signal controller is configured to control the variable attenuator to adjust the power ratio of the RF signals in different RF paths connecting the AiP modules. The amplifier is electrically connected to the variable attenuator and the power combiner. The amplifier is configured to receive the RF signal from the variable attenuator and amplify the power of the RF signal to generate the modulated RF amplified signal. Both the variable attenuators and amplifiers are combined to perform the same function of controlling the power ratio and strengths of the modulated RF signals to ensure sufficient signal strengths, and, therefore, the signal-to-noise ratio for accurate testing.

In an embodiment of the present invention, the system for testing AiP modules further includes a control host electrically connected to the modem, the signal controller, and the signal analyzer and configured to control the operation of the modem, the signal controller and the signal analyzer.

In an embodiment of the present invention, the system for testing AiP modules further includes a test base provided with RF sockets. The RF sockets are respectively electrically connected to the plurality of AiP modules. The power combiner, the signal-controlling circuit, and the plurality of directional couplers are arranged on the test base and electrically connected to the test base.

In an embodiment of the present invention, the signal analyzer is a vector transceiver, a network analyzer, or a vector spectrum analyzer.

In an embodiment of the present invention, a system for the testing of AiP modules includes a transmitting antenna, a signal controller, a plurality of control ICs, a power combiner, and a signal analyzer. The transmitting antenna is configured to generate radio-frequency (RF) signals. The signal controller is electrically connected to a plurality of AiP modules and configured to control the plurality of AiP modules to respectively receive the RF signals. The plurality of control ICs are respectively integrated with the plurality of AiP modules and electrically connected to the plurality of AiP modules and the signal controller. The plurality of control ICs is respectively configured to receive the RF signals. The signal controller is configured to control each of the plurality of control ICs to adjust at least one of the power and phase of the corresponding RF signal to generate a modulated RF amplified signal as a recognition tag with different characteristics for each RF path associated with each of the AiP modules under test. With these recognition tags, the RF characteristics of each AiP module can be identified and separated for testing by a signal processing algorithm for demodulation. The power combiner is electrically connected to each of the plurality of control ICs. The power combiner is configured to receive the modulated RF amplified signal from each of the plurality of control ICs and sum the power of the modulated RF amplified signals of the plurality of control ICs to generate a net mixed test signal. The signal analyzer is electrically connected to the power combiner and configured to receive the net mixed test signals which are processed by the signal processing algorithm for demodulation based on the recognition tags to obtain the RF properties corresponding to at least one of the power and phase of each of the modulated RF amplified signals as recognition tags. With these recognition tags, the RF characteristics of each AiP module can be identified and separated for testing by a signal processing algorithm for demodulation.

In an embodiment of the present invention, each of the plurality of control ICs, a phase shifter, a variable attenuator, and an amplifier. The phase shifter is electrically connected to the signal controller. The phase shifter is configured to receive the RF signal and generate the modulated RF signal with a different phase. The signal controller is configured to control the phase shifter to adjust the phase of the RF signal. The variable attenuator is electrically connected to the signal controller and the phase shifter. The variable attenuator is configured to receive the RF signal from the phase shifter, and generate the modulated RF signal with a different power ratio. The signal controller is configured to control the variable attenuator to adjust the power of the RF signal. The amplifier is electrically connected to the variable attenuator and the power combiner. The amplifier is configured to receive the RF signal from the variable attenuator and amplify the power of the RF signal to generate the modulated RF amplified signal with a different power ratio. Both the variable attenuators and amplifiers are combined to perform the same function of controlling the amplitudes of the modulated RF signals to ensure sufficient signal strengths, and, therefore, the signal-to-noise ratio for accurate testing.

In an embodiment of the present invention, the system for testing AiP modules further includes a control host electrically connected to the signal controller and the signal analyzer and configured to control the operation of the signal controller and the signal analyzer.

In an embodiment of the present invention, the system for testing AiP modules further includes a test base provided with RF sockets. The RF sockets are respectively electrically connected to the plurality of AiP modules. The power combiner is arranged on the test base and electrically connected to the test base.

In an embodiment of the present invention, the signal analyzer is a vector transceiver, a network analyzer, or a vector spectrum analyzer.

In an embodiment of the present invention, a method for testing AiP modules includes: controlling a plurality of AiP modules to respectively receive RF signals from a transmitting antenna adjusting at least one of the power and phase of each of the RF signals to generate recognizable modulated RF amplified signals as recognition tags with different characteristics for each RF path associated with each of the AiP modules under test, summing the power of the modulated RF amplified signals to generate a net mixed test signal; and receiving the net mixed test signal and obtaining RF properties corresponding to at least one of the power and phase of each of the RF amplified signals as recognition tags by signal processing algorithms.

In an embodiment of the present invention, in the step of adjusting at least one of the power and phase of each of the RF signals, the phase and the power of each of the RF signals are sequentially adjusted to generate the modulated RF amplified signals and the associated recognition tags.

To sum up, the system for testing AiP modules and the method for using the same employ the control IC to adjust the phase or power of the RF signal, thereby generating recognition tags with different characteristics for each RF path associated with each of the AiP modules under test. With these recognition tags, the RF characteristics of each AiP module can be identified and separated for testing by a signal processing algorithm for demodulation. According to the phase or the power of the modulated RF amplified signal as the recognition tag, the system for testing AiP modules and the method for using the same receive each RF amplified signal to determine the object under test and shorten the test time.

Below, the embodiments are described in detail in cooperation with the drawings to make easily understand the technical contents, characteristics, and accomplishments of the present invention.

DETAILED DESCRIPTION OF THE INVENTION

Figure 1:
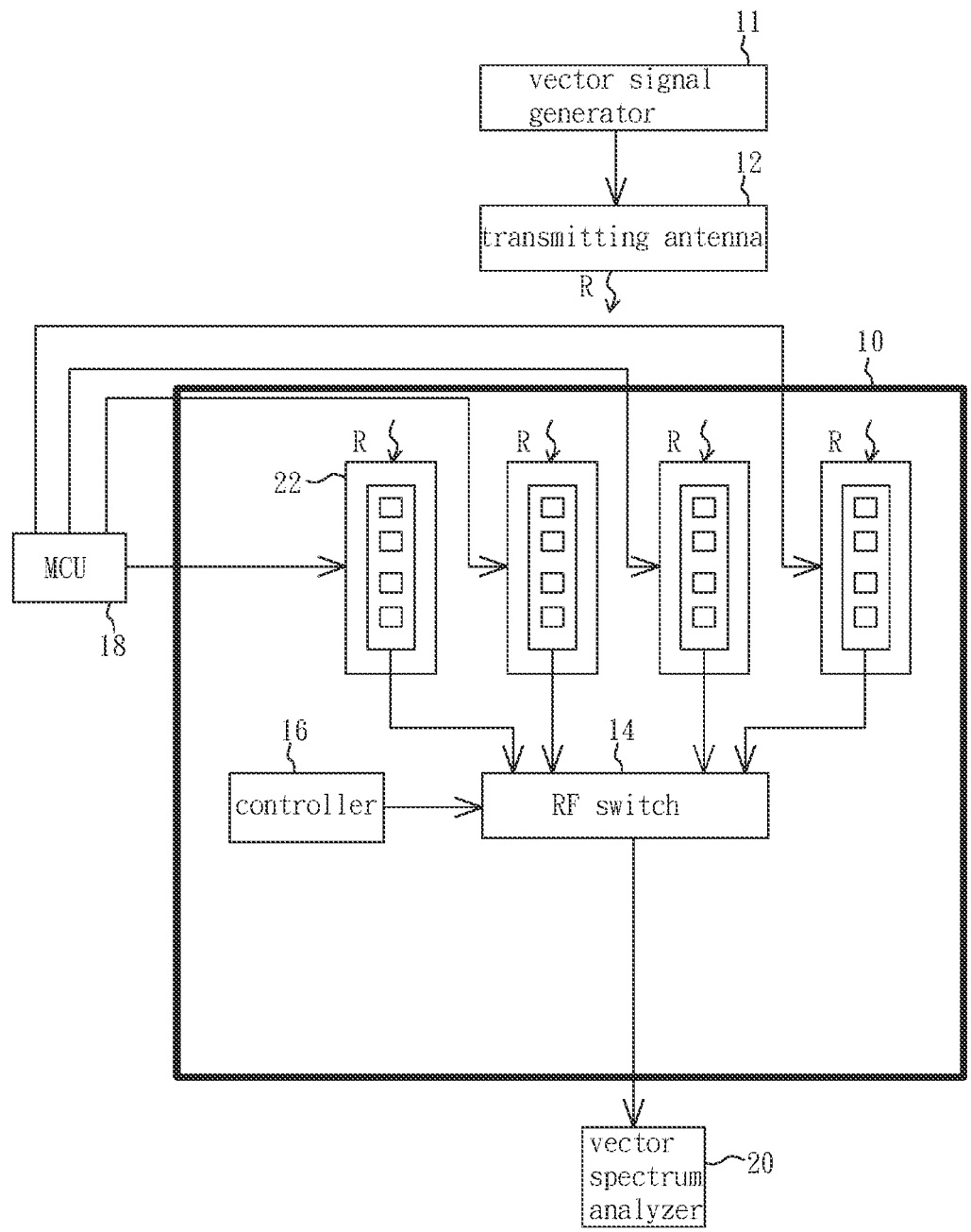
FIG. 1 is a diagram schematically illustrating a conventional system for testing antennas-in-package (AiP)

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Unless otherwise specified, some conditional sentences or words, such as "can", "could". "might", or "may", usually attempt to express that the embodiment in the present invention has, but it can also be interpreted as a feature, element, or step that may not be needed. In other embodiments, these features, elements, or steps may not be required.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

A system for testing antenna-in-package (AiP) modules and a method for using the same will be provided as follows. The system for testing AiP modules and the method for using the same employ a control IC to adjust the phase or the power of the received RF signal, thereby generating recognition tags with different characteristics for each RF path associated with each of the AiP modules under test. According to the phase or the power of the modulated RF amplified signal as the recognition tag, the system for testing AiP modules and the method for using the same receive each modulated RF amplified signal to determine an object under test and shorten the test time.

Figure 2:
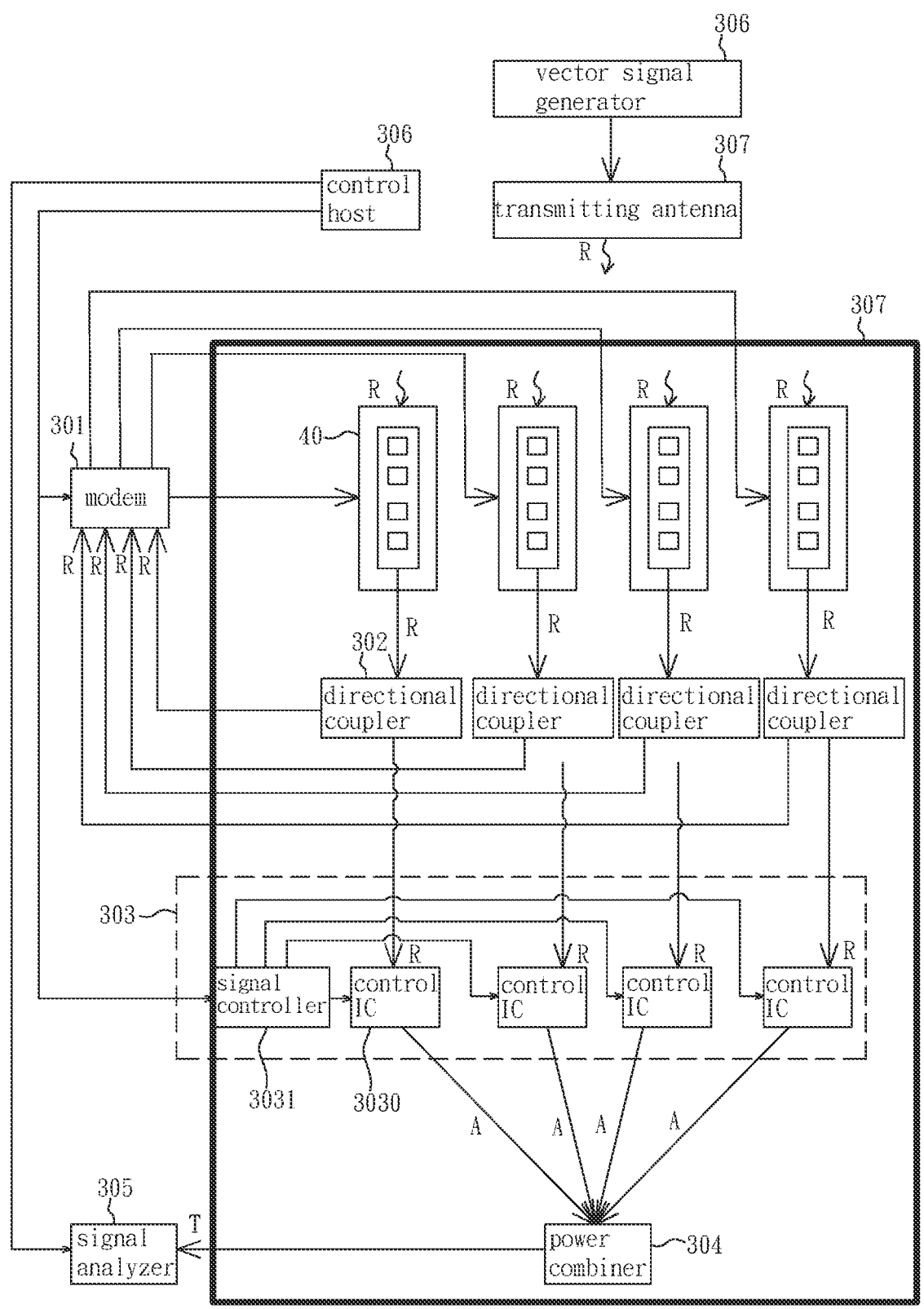
FIG. 2 is a diagram schematically illustrating a system for testing antenna-in-package (AiP) modules according to a first embodiment of the present invention.
Figure 3:
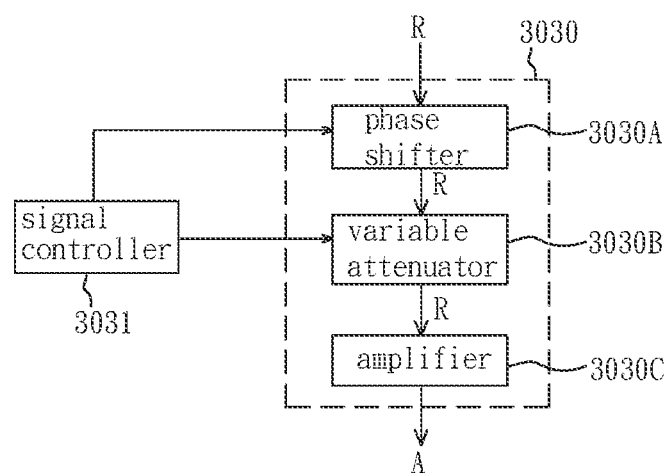
FIG. 3 is a diagram schematically illustrating a control integrated circuit (IC) according to an embodiment of the present invention.

FIG. 2 is a diagram schematically illustrating a system for the testing of AiP modules according to a first embodiment of the present invention. FIG. 3 is a diagram schematically illustrating a control IC according to an embodiment of the present invention. Referring to FIG. 2 and FIG. 3, a first embodiment of a system 30 for testing AiP modules is introduced as follows. The system 30 for testing AiP modules includes a modem 301, a plurality of directional couplers 302, a signal-controlling circuit 303, a power combiner 304, a signal analyzer 305, a vector signal generator 306, and a transmitting antenna 307. The signal analyzer 305 may be, but is not limited to, a vector transceiver, a network analyzer, or a vector spectrum analyzer. The set of AiPs under test may be integrated with the signal analyzer 305. The modem 301 is electrically connected to a plurality of AiP modules 40. The directional couplers 302 are respectively electrically connected to the AiP modules 40 and the modem 301. The signal-controlling circuit 303 is electrically connected to the directional couplers 302. The power combiner 304 is electrically connected to the signal-controlling circuit 303. The signal analyzer 305 is electrically connected to the power combiner 304. The vector signal generator 306 is electrically connected to the transmitting antenna 307. The foregoing components build pairing relations with each other by receiving and sending signals in a communication system. The situation of receiving signals is introduced as follows. The situation of sending signals is mostly identical to that of receiving signals, wherein their directions of signal propagation are opposite.

The method for testing AiP modules is introduced as follows. Firstly, the vector signal generator 306 drives the transmitting antenna 307 to generate testing RF signals R. The modem 301 controls the AiP modules 40 to respectively receive the testing RF signals R. The directional couplers 302 respectively receive the testing RF signals R and transmit the RF signals R to the modem 301 to maintain the normal operation of the AiP modules 40. The signal-controlling circuit 303 receives the RF signals R through the directional couplers 302 and adjusts at least one of the power and the phase of each of the RF signals R to generate recognizable modulated RF amplified signals A as recognition tags with difference. The power combiner 304 receives the modulated RF amplified signals A and sums the power of the RF amplified signals A to generate a net mixed test signal T. The signal analyzer 305 receives the net mixed test signal T, which is processed by the signal processing algorithm for demodulation based on the recognition tags to obtains RF properties corresponding to at least one of the power and the phase of each of the RF amplified signals A as recognition tags with difference. The power and the phase of each modulated RF amplified signal A as the recognition tag represent the mark of the corresponding AiP module 40. The signal analyzer 305 can simultaneously test all the AiP modules 40 and determine the object under test according to the power or the phase of the modulated RF amplified signal A to shorten the test time. When the number of the AiP modules 40 is four, the test time is 8 seconds.

The signal-controlling circuit 303 may include a plurality of control integrated circuits (ICs) 3030 and a signal controller 3031. The control ICs 3030 are respectively electrically connected to the directional couplers 302 and the power combiner 304. The signal controller 3031 is electrically connected to the control ICs 3030. The control ICs 3030 respectively receive the RF signals R. The signal controller 3031 controls the control ICs 3030 to adjust at least one of the power and the phase of each of the RF signals R and drives the control ICs 3030 to respectively generate the modulated RF amplified signals A as recognition tags with differences.

Each of the control ICs 3030 may include a phase shifter 3030A, a variable attenuator 3030B, and an amplifier 3030C. The phase shifter 3030A is electrically connected to the signal controller 3031 and the directional coupler 302. The variable attenuator 3030B is electrically connected to the signal controller 3031 and the phase shifter 3030A. The amplifier 3030C is electrically connected to the variable attenuator 3030B and the power combiner 304. The positions of the phase shifter 3030A, the variable attenuator 3030B, and the amplifier 3030C are adaptable according to requirements. The phase shifter 3030A receives the RF signal R. The signal controller 3031 controls the phase shifter 3030A to adjust the phase of the RF signal R. The variable attenuator 3030B receives the RF signal R from the phase shifter 3030A. The signal controller 3031 controls the variable attenuator 3030B to adjust the power of the RF signal R. The amplifier 3030C receives the RF signal R from the variable attenuator 3030B and amplifies the power of the RF signal R to generate the RF amplified signal A. Both the variable attenuator 3030B and the amplifier 3030C are combined to perform the same function of controlling the amplitudes of the modulated RF signals to ensure sufficient signal strengths, and, therefore, the signal-to-noise ratio for accurate testing.

In some embodiments of the present invention, the device 4 for testing AiP modules may further include a control host 306 electrically connected to the modem 301, the signal controller 3031 and the signal analyzer 305. The control host 306 controls the operation of the modem 301, the signal controller 3031 and the signal analyzer 305. The control host 306 knows the power and the phase of each RF signal R and transmits them to the signal analyzer 305. The signal analyzer 305 recognizes the modulated RF amplified signals A corresponding to the AiP modules 40 by using the recognition tag. In addition, the device 30 for testing AiP modules may further include a test base 307 provided with RF sockets. The RF sockets are respectively electrically connected to the AiP modules 40. The directional couplers 302, the power combiner 304, and the signal-controlling circuit 303 are arranged on the test base 307 and electrically connected to the test base 307.

Figure 4:
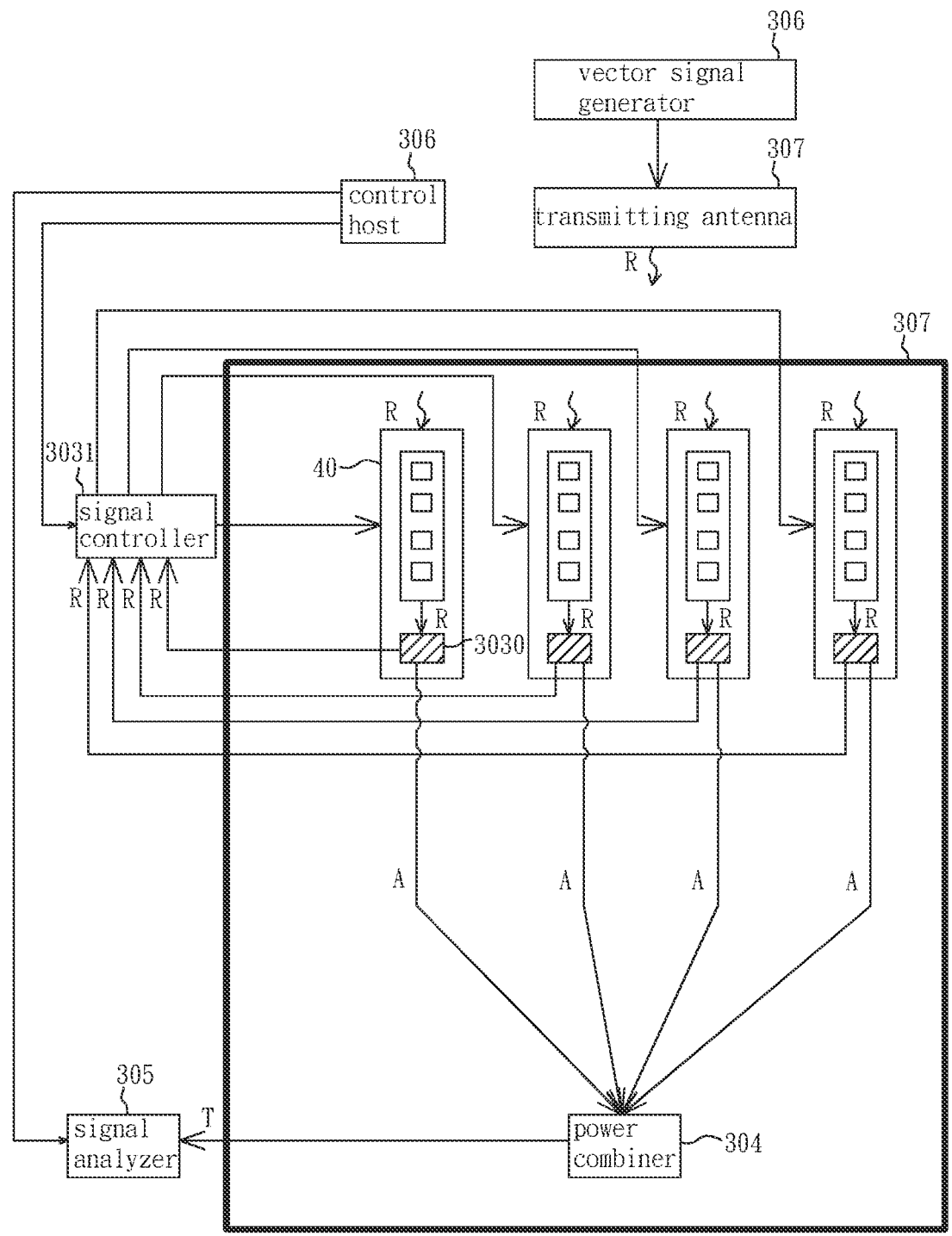
FIG. 4 is a diagram schematically illustrating a system for testing antenna-in-package (AiP) modules according to a second embodiment of the present invention.

FIG. 4 is a diagram schematically illustrating a system for testing AiP modules according to a second embodiment of the present invention. Referring to FIG. 3 and FIG. 4, a second embodiment of the device 4 for testing AiP modules is introduced as follows. The device 30 for testing AiP modules includes a signal controller 3031, a plurality of control integrated circuits (ICs) 3030, a power combiner 304, a signal analyzer 305, a vector signal generator 306, and a transmitting antenna 307. The control ICs may have been built into the AiP modules to form the active AiP modules, such as the RF transceivers. The device 30 for testing AiP modules may further include a set of AiP modules under test configured to emit RF signals R. The AiP modules under test can be integrated with the signal analyzer 305. The signal controller 3031 is electrically connected to a plurality of AiP modules 40. The control ICs are respectively integrated into the AiP modules 40 and electrically connected to the AiP modules 40 and the signal controller 3031. The power combiner 304 is electrically connected to each of the control ICs 3030. The signal analyzer 305 is electrically connected to the power combiner 304. The signal analyzer 305 may be, but not limited to, a vector transceiver, a network analyzer, or a vector spectrum analyzer. The vector signal generator 306 is electrically connected to the transmitting antenna 307. The foregoing components build pairing relations with each other by receiving and sending signals in a communication system. The situation of receiving signals is introduced as follows. The situation of sending signals is mostly identical to that of receiving signals, wherein their directions of signal propagation are opposite.

The method for testing AiP modules is introduced as follows. Firstly, the vector signal generator 306 drives the transmitting antenna 307 to generate testing RF signals R. The signal controller 3031 controls the AiP modules 40 to respectively receive the testing RF signals R radiated from the transmitting antenna 307. The control ICs 3030 respectively receive the RF signals R through the antennas of the AiP modules 40. The signal controller 3031 controls each of the control ICs 3030 to adjust at least one of the power and the phase of the corresponding RF signal R to generate a modulated RF amplified signal A as a recognition tag with difference. The power combiner 304 receives the modulated RF amplified signal A from each of the control ICs 3030 and sums the power of the modulated RF amplified signals A of the control ICs 3030 to generate a test signal T The signal analyzer 305 receives the test signal T, which are processed by the signal processing algorithm for demodulation based on the recognition tags to obtain the RF properties corresponding to at least one of the power and the phase of each of the modulated RF amplified signals A. The power and the phase of each modulated RF amplified signal A as the recognition tag represent the mark of the corresponding AiP module 40. The signal analyzer 305 can simultaneously test all the AiP modules 40 and determine the object under test according to the power or the phase of the modulated RF amplified signal A to shorten the test time. When the number of the AiP modules 40 is four, the test time is 8 seconds.

The internal circuit of the control IC 3030 of the second embodiment and the operation thereof are identical to those of the first embodiment so it will not be reiterated.

In some embodiments of the present invention, the device 30 for testing AiP modules may further include a control host 306 electrically connected to the signal controller 3031 and the signal analyzer 305. The control host 306 controls the operation of the signal controller 3031 and the signal analyzer 305. The control host 306 knows the power and the phase of each RF signal R and transmits them to the signal analyzer 305. The signal analyzer 305 recognizes the modulated RF amplified signals A corresponding to the AiP modules 40. In addition, the device 30 for testing AiP modules may further include a test base 307 provided with RF sockets. The RF sockets are respectively electrically connected to the AiP modules 40. The power combiner 304 is arranged on the test base 307 and electrically connected to the test base 307.

The following paragraphs describe how the signal analyzer 305 determines an object under test based on the recognition tags with a modulation. Assume that the testing transmitting antenna radiates the testing signals, $I_n(t)$, which are received by a set of AiP modules, where t represents time and n is the index of the N AiP modules and RF paths. The net received RF signals from the testing transmitting antenna by the AiP modules is $$I(t) = \sum_{n=1}^{N} I_n(t).$$

The signal generated by the nth control IC is represented with $S_n(t)$ as the recognition tags of the modulated received RF signals. The signal generated by the nth AiP module under test is represented with $R_n(t)$. Thus, $Q_n(t)=S_n(t)R_n(t)$ represents the signal properties along the nth RF paths with the nth AiP module and control IC integrated. If there is no control IC to generate the recognition tags for modulation, $S_n(t)=1$ or only the transmission line generates signal variations. Due to the integrations of AiP modules and the control ICs, the signal variation of each path is represented with $I_n(t)Q_n(t)$. Let the net mixed RF signals combined by the power combiner and measured by the signal analyzer be $V_{tot}(t)$, where t represents time. The signals are received by AiP modules in a group.

Under the entire architecture, the sum $V_{tot}(t)$ of the received signals is expressed by formula (1).

$$V_{tot}(t) = \sum_{n=1}^{N} I_n(t)Q_n(t) \tag{1}$$

Formula (1) indicates the electromagnetic (EM) fields radiated from the testing transmitting antenna are naturally distributed to illuminate the AiP modules along each RF paths. On the other hand, in the transmitting mode of the AiP modules, the EM waves are naturally combined in the free space to be received by the testing antennas. In the current receiving mode of the AiP modules, they are received by the AiP modules to receive the signals simultaneously. The justifications of the AiP modules need the information of $I_n(t)Q_n(t)$, especially $Q_n(t)$, because $I_n(t)$ is known. According to formula (1), $I_n(t)Q_n(t)$ can be solved. $I_n(t)R_n(t)$ can be found if $S_n(t)$ is a controllable and recognizable tag function, such that the signals of AiP modules are different from each other. Therefore, formula (2) is obtained according to formula (1) by $$V_{tot}(t) = \sum_{n=1}^{N} S_n(t)[I_n(t)R_n(t)] \tag{2}$$

Formula (2) has N unknown functions to indicate the N signal characteristics along the N RF paths of AiP modules. N different signals are needed to solve the N $[I_n(t)R_n(t)]$. As a result, the technology focuses on generating $S_n(t)$ and using hardware to implement $S_n(t)$.

(1) Assume $S_n(t)=\delta(t-t_n)$, where $\delta(\ )$ represent a pulse function and $t_n$ represents the nth time point.

$$V_{tot}(t_{n-1} < t < t_n) = I_n(t)R_n(t) \tag{3}$$

Formula (3) may be implemented by switching the AiP modules or other components, as illustrated in FIG. 3. Alternatively, Formula (3) may be implemented by the switch of the AiP module. As a result, the recognition code of the nth path is 00 ... 100 ... etc.

(2) One assumes $$S_n(t) = e^{j\frac{2\pi n m}{N}}.$$

passes $S_n(t)$ in formula (2) to obtain formula (4)

$$V_{tot}(t) = \sum e^{j\frac{2\pi n m}{N}} [I_n(t) R_n(t)] \quad (4)$$

According to formula (4), a constant phase variation is generated to obtain the relation of discrete Fourier transform (DFT), thereby solving (3) One assumes that $S_n(t)$ generates orthogonal signals. It can be solved by the inner product of vectors of the mathematical function, as shown by formula (5).

$$[I_n(t) R_n(t)](S_n(t), S_n(t)) = (V_{tot}(t), S_n(t)) \quad (5)$$

(4) If $S_n(t)$'s signals are not orthogonal, then formula (5) generate a set of linear equations. One may solve the linear equations to find $[I_n(t) R_n(t)]$.

(5) If the internal RF devices of the AiP module can be accessed, the $R_n(t)=1$, but $S_n(t)=R'_n(t) \; S'_n(t)$ inside the AiP, where the $R'_n(t)$ represents the responses of the controllable devices in the AiP module.

According to the embodiments provided above, the system for testing AiP modules and the method for using the same employ a control IC to adjust the phase or the power of a RF signal, thereby generating recognition tags with difference.

According to the phase or the power of the RF amplified signal, the system for testing AiP modules and the method for using the same implant the recognition tags to determine the object under test and shorten the test time.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A system for testing antenna-in-package (AiP) modules comprising:
    a transmitting antenna configured to generate radio-frequency (RF) signals;
    a modem electrically connected a plurality of antenna-in-package (AiP) modules and configured to control the plurality of AiP modules to respectively receive the RF signals;
    a plurality of directional couplers respectively electrically connected to the plurality of AiP modules and the modem and respectively configured to receive the RF signals and transmit the RF signals to the modem to maintain normal operation of the plurality of AiP modules;
    a signal-controlling circuit electrically connected to the plurality of directional couplers and configured to receive the RF signals through the plurality of directional couplers, wherein the signal-controlling circuit is configured to adjust at least one of power and a phase of each of the RF signals to generate recognizable modulated RF amplified signals as recognition tags with a difference; and
    a power combiner electrically connected to the signal-controlling circuit, wherein the power combiner is configured to receive the RF amplified signals, and sum power of the RF amplified signals to generate a test signal;
    a signal analyzer electrically connected to the power combiner and configured to receive the test signal and obtain RF properties corresponding to at least one of power and a phase of each of the RF amplified signals; and
    a control host electrically connected to the modem and the signal analyzer and configured to control operation of the modem and the signal analyzer, wherein the control host is configured to know power and a phase of each of the RF signals and transmit them to the signal analyzer, and the signal analyzer is configured to recognize the RF amplified signals respectively corresponding to the AiP modules by using power and a phase of each of the RF signals.

2. The system for testing AiP modules according to claim 1, wherein the signal-controlling circuit comprises:
    a plurality of control integrated circuits (ICs) respectively electrically connected to the plurality of directional couplers and the power combiner, wherein the plurality of control ICs are respectively configured to receive the RF signals; and
    a signal controller electrically connected to the plurality of control ICs and the control host, wherein the signal controller is configured to control the plurality of control ICs to adjust at least one of the power, and the phase of each RF signal to respectively generate the RF amplified signals as recognition tags with a difference;
    wherein the control host is configured to control operation of the signal controller.

3. The system for testing AiP modules according to claim 2, wherein each of the plurality of control ICs comprises:
    a phase shifter electrically connected to the signal controller and the plurality of directional couplers, wherein the phase shifter is configured to receive the RF signal, and the signal controller is configured to control the phase shifter to adjust a phase of the RF signal;
    a variable attenuator electrically connected to the signal controller and the phase shifter, wherein the variable attenuator is configured to receive the RF signal from the phase shifter, and the signal controller is configured to control the variable attenuator to adjust power ratio of the RF signal; and
    an amplifier electrically connected to the variable attenuator and the power combiner, wherein the amplifier is configured to receive the RF signal from the variable attenuator and amplify power of the RF signal to generate the RF amplified signal for good signal-to-noise ratio.

4. The system for testing AiP modules according to claim 1, further comprising a test base provided with RF sockets, wherein the RF sockets are respectively electrically connected to the plurality of AiP modules, wherein the power combiner, the signal-controlling circuit, and the plurality of directional couplers are arranged on the test base and electrically connected to the test base.

5. The system for testing AiP modules according to claim 1, wherein the signal analyzer is a vector transceiver, a network analyzer, or a vector spectrum analyzer.

6. A system for testing antenna-in-package (AiP) modules comprising:
    a transmitting antenna configured to generate radio-frequency (RF) signals;

a signal controller electrically connected to a plurality of antenna in package (AiP) modules and configured to control the plurality of AiP modules to respectively receive the RF signals;

a plurality of control ICs respectively integrated in the plurality of AiP modules and electrically connected to the plurality of AiP modules and the signal controller, wherein the plurality of control ICs are respectively configured to receive the RF signals, the signal controller is configured to control each of the plurality of control ICs to adjust at least one of power and a phase of the corresponding RF signal to generate a RF amplified signal as a recognition tag with difference;

a power combiner electrically connected to each of the plurality of control ICs, wherein the power combiner is configured to receive the RF amplified signal from each of the plurality of control ICs and sum power of the RF amplified signals of the plurality of control ICs to generate a test signal;

a signal analyzer electrically connected to the power combiner and configured to receive the test signal and obtain RF properties corresponding to at least one of power and a phase of each of the RF amplified signals as recognition tags; and a control host electrically connected to the signal controller and the signal analyzer and configured to control operation of the signal controller and the signal analyzer, wherein the control host is configured to know power and a phase of each of the RF signals and transmit them to the signal analyzer, and the signal analyzer is configured to recognize the RF amplified signals respectively corresponding to the AiP modules by using power and a phase of each of the RF signals.

7. The system for testing AiP modules according to claim 6, wherein each of the plurality of control ICs comprises:

a phase shifter electrically connected to the signal controller, wherein the phase shifter is configured to receive the RF signal, and the signal controller is configured to control the phase shifter to adjust a phase of the RF signal;

a variable attenuator electrically connected to the signal controller and the phase shifter, wherein the variable attenuator is configured to receive the RF signal from the phase shifter, and the signal controller is configured to control the variable attenuator to adjust power of the RF signal; and an amplifier electrically connected to the variable attenuator and the power combiner, wherein the amplifier is configured to receive the RF signal from the variable attenuator and amplify power of the RF signal to generate the RF amplified signal.

8. The system for testing AiP modules according to claim 6, further comprising a test base provided with RF sockets, wherein the RF sockets are respectively electrically connected to the plurality of AiP modules, wherein the power combiner is arranged on the test base and electrically connected to the test base.

9. The system for testing AiP modules according to claim 6, wherein the signal analyzer is a vector transceiver, a network analyzer, or a vector spectrum analyzer.

10. A method for testing antenna in package (AiP) modules comprising:

controlling a plurality of antenna in package (AiP) modules to respectively receive radio-frequency (RF) signals;

adjusting at least one of power and a phase of each of the RF signals to generate recognizable RF amplified signals as recognition tags with difference;

summing power of the RF amplified signals to generate a test signal; and receiving the test signal and obtaining RF properties corresponding to at least one of power and a phase of each of the RF amplified signals as recognition tags and knowing power and a phase of each of the RF signals to recognize the RF amplified signals respectively corresponding to the AiP modules by using power and a phase of each of the RF signals.

11. The method for testing AiP modules according to claim 10, wherein in the step of adjusting at least one of the power and the phase of each of the RF signals, the phase and the power of each of the RF signals are sequentially adjusted.

12. The method for testing AiP modules according to claim 10, wherein adjustments of power and phase of each of the RF signals are implemented to produce orthogonal and independent modulated signals or mathematical-form signal basis functions for each RF path, dependent modulated signals or mathematical-form signal basis functions have N ranks of independent modulated signals, and the orthogonal and independent modulated signals, N-rank dependent signals or the mathematical-form signal basis functions are used to decompose a sum of combined signals into separate signals associated with each RF path through operation of inner products, and used to identify characteristics of the plurality of AiP modules under test.

* * * * *